(12) United States Patent
Tsai et al.

(10) Patent No.: US 12,034,063 B2
(45) Date of Patent: Jul. 9, 2024

(54) SEMICONDUCTOR DEVICES AND METHODS OF MANUFACTURING THEREOF

(71) Applicant: Taiwan Semiconductor Manufacturing Company Ltd., Hsinchu (TW)

(72) Inventors: Ya-Yi Tsai, New Taipei (TW); Yi-Chun Chen, Hsinchu (TW); Wei-Han Chen, Hsinchu (TW); Wei-Ting Guo, Hsinchu (TW); Shu-Yuan Ku, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/232,533

(22) Filed: Aug. 10, 2023

(65) Prior Publication Data

US 2023/0387271 A1    Nov. 30, 2023

Related U.S. Application Data

(62) Division of application No. 17/460,208, filed on Aug. 28, 2021, now Pat. No. 11,791,403.

(51) Int. Cl.
*H01L 29/76* (2006.01)
*H01L 21/8234* (2006.01)
(Continued)

(52) U.S. Cl.
CPC .. *H01L 29/6681* (2013.01); *H01L 21/823431* (2013.01); *H01L 21/823481* (2013.01);
(Continued)

(58) Field of Classification Search
CPC ......... H01L 29/6681; H01L 21/823431; H01L 21/823481; H01L 27/0886; H01L 29/0649;
(Continued)

(56) References Cited

U.S. PATENT DOCUMENTS 10,177,240 B2 *  1/2019  Greene ............... H01L 29/0649
11,923,248 B2 *  3/2024  Zang .................... H01L 29/785
(Continued)

*Primary Examiner* — Theresa T Doan
(74) *Attorney, Agent, or Firm* — FOLEY & LARDNER LLP

(57) ABSTRACT

A method of fabricating a semiconductor device is described. A plurality of semiconductor fins is formed in a first region on a substrate. An isolation region is formed around the plurality of semiconductor fins. Dummy fins are formed extending above the isolation region and laterally adjacent the plurality of semiconductor fins. A first etch is performed to etch the plurality of semiconductor fins such that a top surface of the plurality of semiconductor fins has a same height as a top surface of the isolation region. A second etch is performed selectively etching the isolation region to form a first recess in the isolation region laterally adjacent the semiconductor fins. A third etch is performed selectively etching the plurality of semiconductor fins to remove the plurality of semiconductor fins and to etch a second recess through the isolation region into the semiconductor substrate.

20 Claims, 12 Drawing Sheets

(51) Int. Cl.
   *H01L 27/088* (2006.01)
   *H01L 29/06* (2006.01)
   *H01L 29/66* (2006.01)
   *H01L 29/78* (2006.01)
   *H01L 29/94* (2006.01)

(52) U.S. Cl.
   CPC ...... *H01L 27/0886* (2013.01); *H01L 29/0649* (2013.01); *H01L 29/7851* (2013.01)

(58) Field of Classification Search
   CPC ............... H01L 29/7851; H01L 29/785; H01L 29/0673; H01L 29/42392; H01L 29/775; H01L 29/78696
   USPC ......................................................... 257/288
   See application file for complete search history.

(56) References Cited

U.S. PATENT DOCUMENTS

2019/0393324 A1   12/2019   Chen et al.
2021/0249313 A1   8/2021    Chen et al.

\* cited by examiner

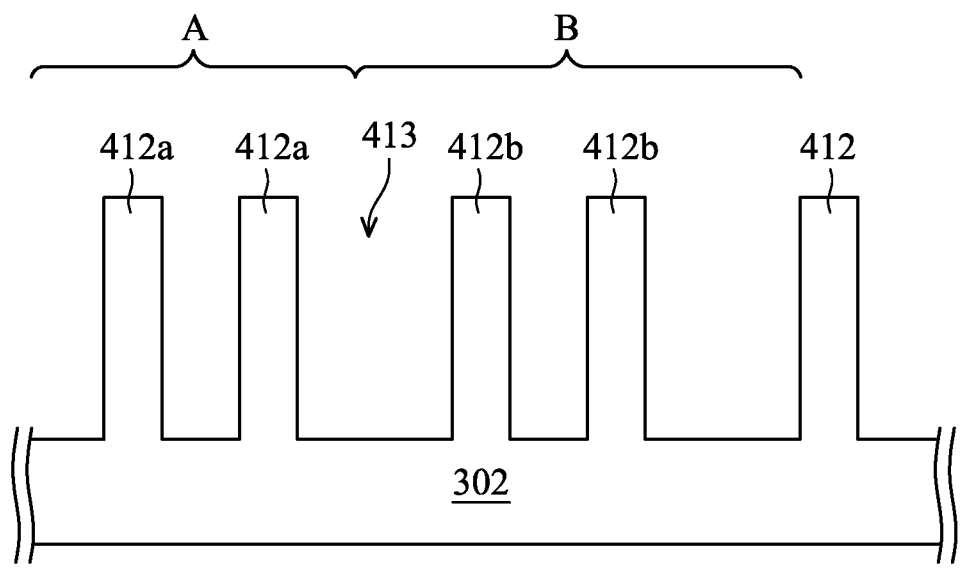
FIG. 3
FIG. 4
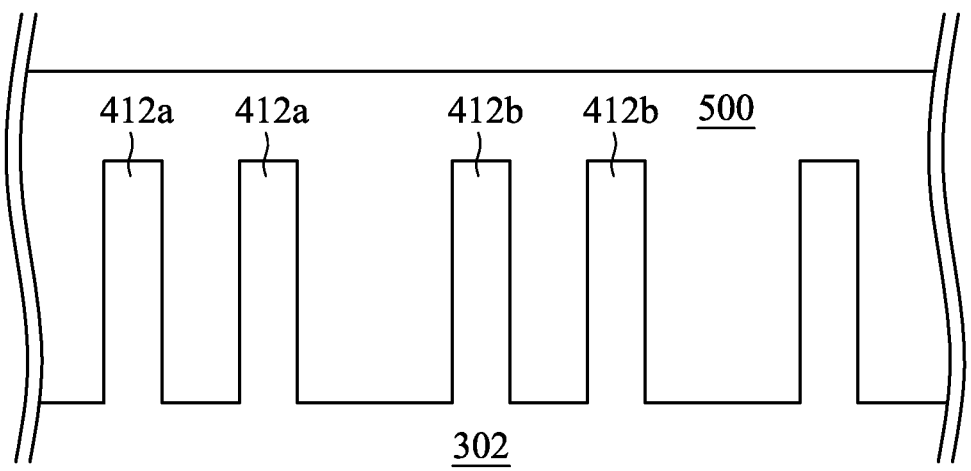
FIG. 5

SEMICONDUCTOR DEVICES AND METHODS OF MANUFACTURING THEREOF

CROSS REFERENCE TO RELATED APPLICATIONS

This present application is a Divisional of Ser. No. 17/460,208, filed on Aug. 28, 2021, the entire disclosure of which is incorporated herein by reference.

BACKGROUND

This disclosure relates generally to a semiconductor device, and in some embodiments, to transistor devices that include an etch process including dielectric isolation push.

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC structures (such as three-dimensional transistors) and processing and, for these advancements to be realized, similar developments in IC processing and manufacturing are needed. For example, device performance (such as device performance degradation associated with various defects) and fabrication cost of field-effect transistors become more challenging when device sizes continue to decrease. Although methods for addressing such a challenge have been generally adequate, they have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3-7, 10A, 11A, 12A, 13A, 14A, 15A, 16 and 17 illustrate cross-sectional views cut along a Y-cut direction of FIG. 1, cut along a direction of the gate, the Y-cut direction being perpendicular to the X-cut direction, during various fabrication stages in accordance with some embodiments.

DETAILED DESCRIPTION

Figure 1:
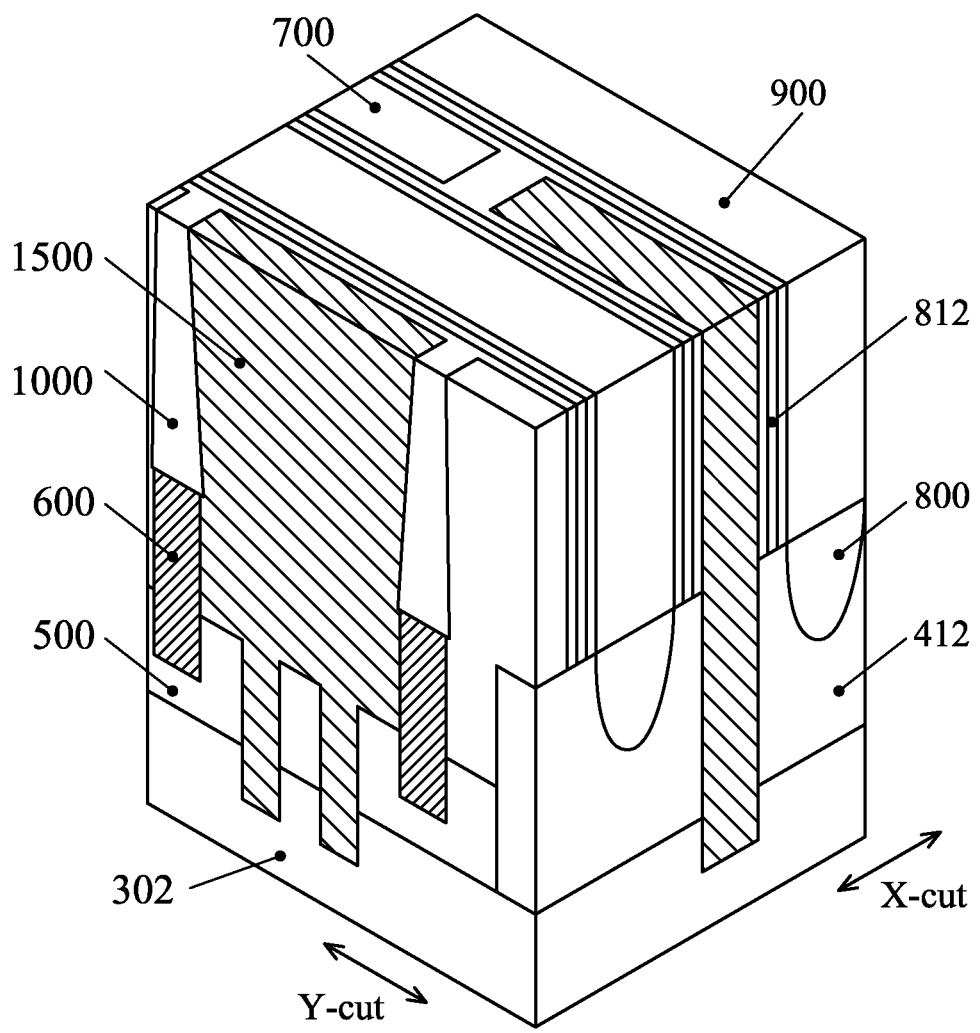
FIG. 1 is a perspective view illustrating a semiconductor device according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In contemporary semiconductor device fabrication processes, a large number of semiconductor devices, such as field effect transistors ("FETs"), are fabricated on a single wafer. Non-planar transistor device architectures, such as fin-based transistors (typically referred to as "FinFETs"), can provide increased device density and increased performance over planar transistors. Some advanced non-planar transistor device architectures, such as nanosheet (or nanowire) transistors, can further increase the performance over the FinFETs. When compared to the FinFET where the channel is partially wrapped (e.g., straddled) by a gate structure, the nanosheet transistor, in general, includes a gate structure that wraps around the full perimeter of one or more nanosheets for improved control of channel current flow. For example, in a FinFET and a nanosheet transistor with similar dimensions, the nanosheet transistor can present larger driving current (Ion), smaller subthreshold leakage current (Ioff), etc. Such a transistor that has a gate structure fully wrapping around its channel is typically referred to as a gate-all-around (GAA) transistor of GAAFET.

The present disclosure provides various embodiments of a semiconductor device, which may include a FinFET, GAAFET, or nanosheet FET (NSFET) transistor. Embodiments of the present disclosure are discussed in the context of forming a non-planar transistor, such as a FinFET, GAAFET, or NSFET transistor, and in particular, in the context of a semiconductor device. A substrate is provided. A plurality of semiconductor fins is formed in a first region on a substrate. An isolation region is formed around the plurality of semiconductor fins. A top surface of the plurality of semiconductor fins is above a top surface of the dielectric isolation. A first etch is performed to etch the plurality of semiconductor fins such that a top surface of the plurality of semiconductor fins has a same height as a top surface of the isolation region. A second etch is performed selectively etching the isolation region to form a first recess in the isolation region laterally adjacent the semiconductor fins. A third etch is performed selectively etching the plurality of semiconductor fins to remove the plurality of semiconductor fins and to etch a second recess through the isolation region into the semiconductor substrate.

A semiconductor device manufacturing method as described can provide advantages. According to some embodiments, the isolation region is etched after an initial fin top removal. The etching of the isolation region (shallow trench isolation (STI)) (STI push) beneficially enlarges the opening critical dimension (CD) prior to subsequent etching to remove the fin bottom and etch into the semiconductor substrate. The etching of the STI reduces the aspect ratio for the fin removal and etch into the semiconductor substrate. Under the lower aspect ratio it is easier to perform fin bottom removal and silicon substrate etch leading to better performance. Further the process window is enlarged and yield is improved.

FIG. 1 is a perspective view illustrating the semiconductor device showing the cross-sectional cuts in the X-cut and Y-cut directions. FIG. 1 illustrates the device 100 with S/D structures 800, substrate 302, fins 412, isolation dielectric 500, dummy fins 600, dummy gate structure 700, spacer 812, ILD 900, refill dielectric material 1000 and dielectric material 1500.

Figure 2:
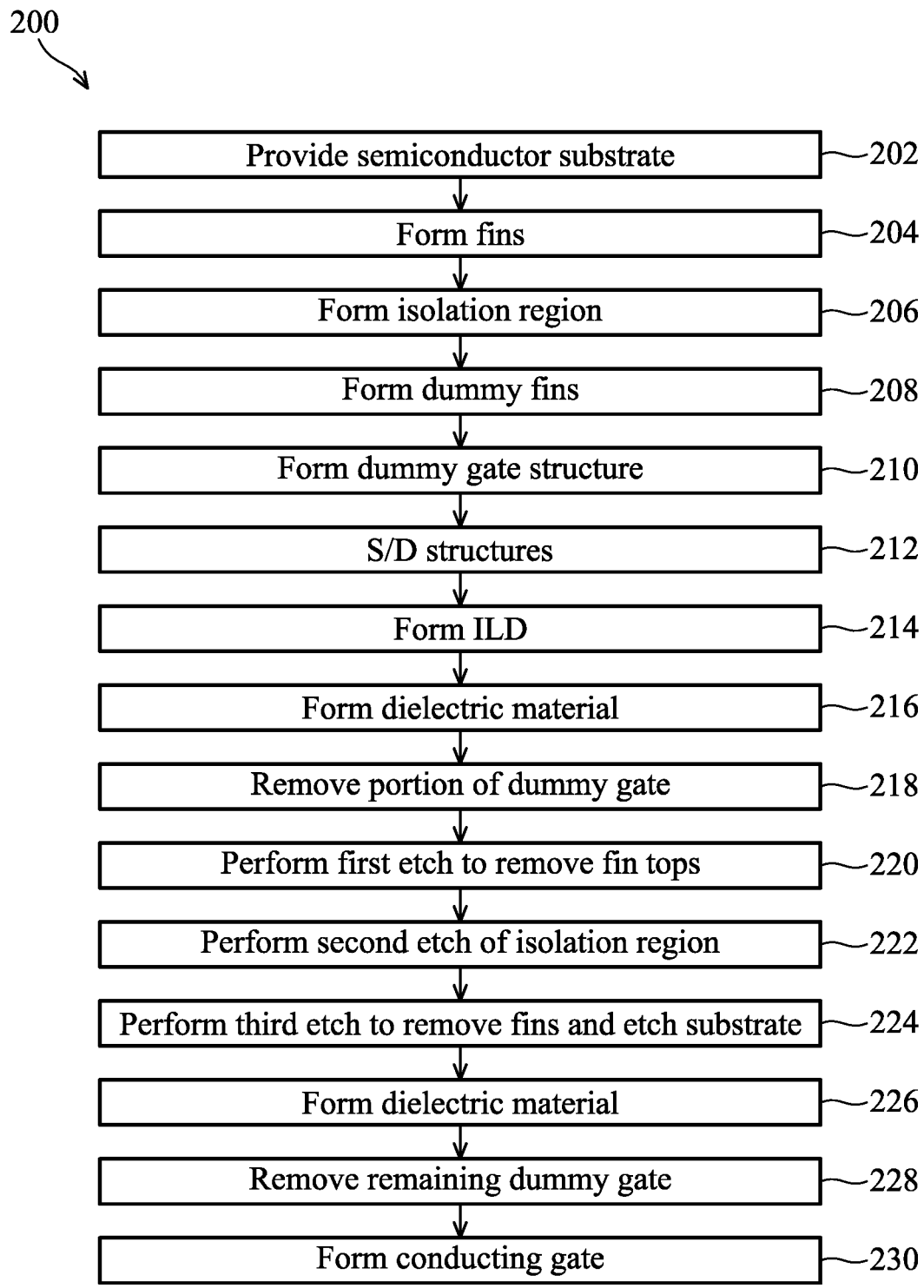
FIG. 2 illustrates a flow chart of an example method to make a semiconductor device, in accordance with some embodiments.

FIG. 2 illustrates a flowchart of a method 200 to form a non-planar transistor device, according to one or more embodiments of the present disclosure. For example, at least some of the operations (or steps) of the method 200 can be used to form a FinFET (or a GAA) transistor device. Further, the method 200 can be used to form a FinFET transistor (or GAA transistor) device in a respective conduction type such as, for example, an n-type transistor device or a p-type transistor device. The term "n-type," as used herein, may be referred to as the conduction type of a transistor having electrons as its conduction carriers, and the term "p-type," as used herein, may be referred to as the conduction type of a transistor having holes as its conduction carriers.

FIG. 2 illustrates a flowchart of a method 200 to form a semiconductor device according to one or more embodiments of the present disclosure. It is noted that the method 200 is merely an example, and is not intended to limit the present disclosure. In some embodiments, the semiconductor device includes, at least part of, a fin field-effect-transistor (FinFET), but can include any of various other transistors (e.g., a GAAFET, a nanosheet field-effect-transistor) while remaining within the scope of the present disclosure.

Referring to FIG. 2, the method 200 starts with operation 202 in which a semiconductor substrate is provided. The method 200 continues to operation 204 in which fins are formed. Then in operation 206 an isolation region is formed. Continuing to operation 208, dummy fins are formed. Continuing to operation 210, a dummy gate is formed. Continuing to operation 212, source and drain (S/D) structures are formed. Continuing to operation 214 an interlayer dielectric (ILD) is formed. Continuing to operation 216, dielectric structures are formed through the dummy gate to the dummy fins. Continuing to operation 218 a portion of the dummy gate between the dielectric structures is removed. Continuing to operation 220 a first etch is performed to remove top portions of the fins in the region between the dielectric structures. Continuing to operation 222 a second etch is performed to etch the isolation region around fins in the region between the dielectric structures. Continuing to operation 224 a third etch is performed to remove the fins in the region between the dielectric structures and to etch into the semiconductor substrate. Continuing to operation 226 a dielectric refill material is formed in the region between the dielectric structures. Continuing to operation 228, the remaining dummy gate is removed. Continuing to operation 230 a conducting gate is formed.

In the following discussions, the operations of the method 200 may be associated with views of a semiconductor device 100 at various fabrication stages. In some embodiments, the semiconductor device 100 may be a FinFET. In other embodiments the semiconductor device 100 may be a GAAFET or nanosheet FET (NSFET).

Corresponding to operation 202 of FIG. 2, FIG. 3 is a view of the semiconductor device 100 including a substrate 302 at one of the various stages of fabrication, according to some embodiments. In some embodiments, the substrate 302 is covered by a photo-sensitive layer and is patterned to subsequently form one or more fins (which may be channels in the final device) of the semiconductor device, which will be discussed in the following operations.

For a FinFET structure, the substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Corresponding to operation 204 of FIG. 1, FIG. 4 is a view of the semiconductor device 100 including a plurality of fins 412 at one of the various stages of fabrication, according to some embodiments. As shown, trenches 413 are disposed between adjacent fins 412. It is noted that although five fins 412 are shown in the illustrated embodiments of FIG. 4 (and the following figures), any desired number of fins may be formed on the semiconductor substrate 302. As such, when multiple fins are formed on the substrate 302 that are in parallel with one another, the fins can be spaced apart from one another by a corresponding trench 413.

The fins 412 are separated into regions A and B, where the fins 412a are in region A (second region) and the fins 412b are in region B (first region). Region B is subject to a three-step etch process to remove the fins 412b and etch the substrate 302 in regions where the fins 412b are removed, as discussed in more detail below. The fins 412a in region A are not subject to the three-step etch process. The reference character 412 refers to a fin generically, while the reference characters 412a and 412b refer to a fin in region A and region B, respectively.

The region B may correspond to a cut polysilicon on the diffusion edge (CPODE) region (where there is dummy gate polysilicon (PO) at the FIN edge), and the fins 412b are to be removed. The region A may correspond to a region where a conductive gate is formed over the fins 412a. The disclosure is not so limited as to the function of the regions A and B, however.

The fins 412 may be formed by a photolithographic process, for example. A photo-sensitive layer may be patterned in a photolithographic process, for example, and may be used as an etch mask to etch the substrate 302 to form fins 412, including fins 412a and 412b, and trenches 413 between the fins 412, in the substrate 302. Portions of the semiconductor substrate 302 sandwiched between the trenches 413 are thus formed as fins 412. The fins 412 each extend upward from a surface of the substrate 302. The trenches 413 may be strips (viewed from the top of the semiconductor device 100) parallel to each other, and closely spaced with respect to each other. After the fins 412 are formed, the photo-sensitive layer may be removed. Subsequently, a cleaning process may be performed to remove a native oxide of the semiconductor substrate 302. The cleaning may be performed using diluted hydrofluoric (DHF) acid, or the like, for example.

Corresponding to operation 206 of FIG. 2, FIG. 5 is a view of the semiconductor device 100 including isolation regions 500 at one of the various stages of fabrication, according to some embodiments. The isolation regions 500, which are formed of an insulation material, such as a dielectric, can electrically isolate neighboring fins from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 500 and a top surface of the fins 412 that are coplanar (not shown).

In some embodiments, the fins 412 include a liner, e.g., a liner oxide (not shown), at the interface between each of the isolation region 500 and the substrate 302 (fins 412). In some embodiments, the liner oxide is formed to reduce crystalline defects at the interface between the substrate 302 and the isolation regions 500. Similarly, the liner oxide may also be used to reduce crystalline defects at the interface between the fins 412 and the isolation region 500. The liner oxide (e.g., silicon oxide) may be a thermal oxide formed through a thermal oxidation of a surface layer of the substrate 302, although other suitable methods may also be used to form the liner oxide.

Figure 6:
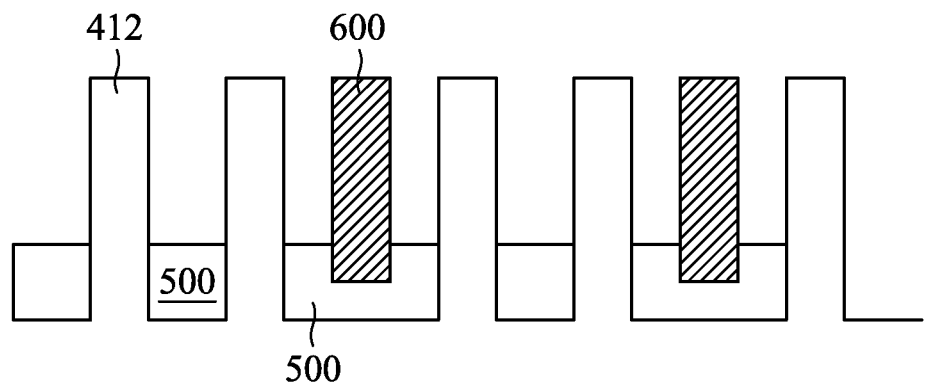

Corresponding to the operation 208 of FIG. 2, FIG. 6 illustrates a view of the semiconductor device 100 including dummy fins 600 at one of the various stages of fabrication, according to some embodiments. The dummy fins 600 may be formed in the isolation region 500 between the some of the fins 412. The dummy fins 600 may, in some embodiments, be formed in a recess in the isolation region 500 before the overall isolation region 500 is recessed to expose upper regions of the fins 412 in formation of the STI regions 500. The recess may be formed by a photolithographic method including etching to form the recess. For example, the photolithographic method may include a dry etch or a wet etch using dilute hydrofluoric (DHF) acid to form the recess. In some embodiments the dummy fins may be formed before STI regions 500, and the dummy fins may be entirely embedded in the STI regions 500.

Next, the isolation regions 500 are recessed to form shallow trench isolation (STI) regions 500, as shown in FIG. 6. The isolation regions 500 are recessed such that the upper portion of the fins 412 protrude from between neighboring STI regions 500. In other words, the fins 412 are protruded from a top surface of the STI regions 500. The top surface of the STI regions 500 may have a flat surface (as illustrated), a convex surface, a concave surface (such as dishing), or combinations thereof. The top surface of the STI regions 500 may be formed flat, convex, and/or concave by an appropriate etch. The isolation regions 500 may be recessed using an acceptable etching process, such as one that is selective to the material of the isolation regions 500. For example, a dry etch or a wet etch using dilute hydrofluoric (DHF) acid may be performed to recess the isolation regions 500.

The dummy fins 600 may be formed of a dummy fin material which is deposited in the recess, where excess dummy fin material is then removed such as by etching or polishing. The dummy fin material may be an insulating material, for example. The dummy fin material may include a material selected from the group consisting of silicon oxide, silicon nitride, silicon carbide, silicon oxycarbide, silicon oxynitride, silicon carbonitride, silicon oxycarbonitride, and combinations thereof. The dummy fin material may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. In some other embodiments, the dummy fin material may include a high-k dielectric material. As such, the dummy fin material may have a k value greater than about 4.0 or even greater than about 7.0, and may include a metal oxide or a silicate of Hf, Al, Zr, La, Mg, Ba, Ti, Pb, and combinations thereof. The dummy fin material may be TaN, TaO, $Al_2O_3$, or HfO, for example. The formation methods of such a high-k dummy fin material may include CVD molecular beam deposition (MBD), atomic layer deposition (ALD), PECVD, and the like. Excess dummy fin material is then removed such as by etching back or polishing.

The dummy fins 600 may be formed to be embedded in the STI 500. In this case, a dummy fin material for the dummy fin 600s is formed in the region between the fins 412. The dummy fins 600 may be formed of the dummy fin material which is deposited in the region between the fins 412, where dummy fin material may then be patterned such as by etching. The isolation region 500 material may be formed over the fins 412 and dummy fins 600, in some embodiments. The isolation regions 500 may be formed of an insulating material in a similar manner as described with respect to FIG. 5. A polishing process, such as CMP, may be performed to planarize and remove portions of the isolation regions 500, fins 412 and dummy fins 600. An etch back may be performed to remove upper portions of the isolation regions 500.

Figure 7:
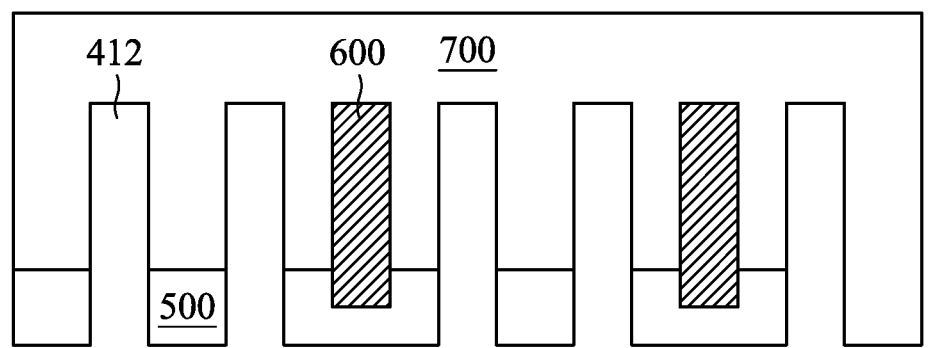

Corresponding to the operation 210 of FIG. 2, FIG. 7 illustrates views of the semiconductor device 100 including a dummy gate structure 700 at one of the various stages of fabrication, according to some embodiments.

The dummy gate structure 700 may be formed from a dummy gate layer formed over the fins 412 and then planarized, such as by a CMP. A mask layer may be deposited over the dummy gate layer. The dummy gate layer may be formed of, for example, polysilicon, although other materials may also be used. The mask layer may be formed of, for example, silicon nitride or the like. After the layers (e.g., the dummy gate layer, and the mask layer) are formed, the mask layer may be patterned using acceptable photolithography and etching techniques to form a mask. The pattern of the mask then may be transferred to the dummy gate layer by an acceptable etching technique to form the dummy gate structure 700. The patterned dummy gate structure 700 has regions exposing each of the fins 412 for subsequent source/drain (S/D) structure formation.

Figure 8:
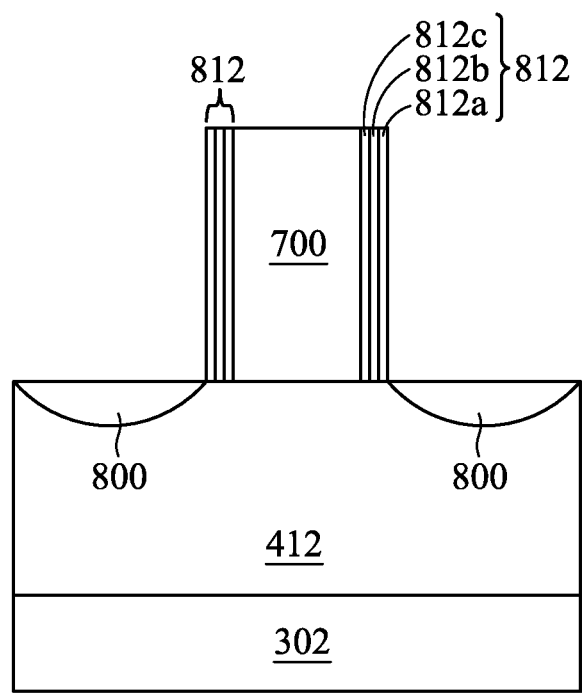
FIGS. 8, 9, 10B, 11B, 12B, 13B, 14B and 15B, illustrate cross-sectional views cut along an X-cut direction of FIG. 1, cut along a direction of one of the fins, made by the method of FIG. 2, during various fabrication stages in accordance with some embodiments.

Corresponding to the operation 212 of FIG. 2, FIG. 8 is a view of the semiconductor device 100 in which S/D structures are epitaxially formed. The cross sectional view of FIG. 8 is an X-cut which is cut within the S/D structures, and is a cross sectional view perpendicular to the Y-cut.

Sidewall spacers 812 may be formed on sidewalls of the dummy structures 700. FIG. 8 illustrates three sidewall spacers 812a, 812b and 812c. The number of sidewall spacers, however, is not so limited, and may be more or less than three. The three sidewall spacers 812a, 812b and 812c may be formed from a dielectric material such as silicon nitride, silicon carbonitride, silicon oxycarbonitride, silicon oxycarbide, silicon, metal oxides, the like, or a combination thereof, and may be formed by a conformal deposition process such as CVD, PECVD, or the like. The three sidewall spacers 812a, 812b and 812c may be formed of a material different from each other. After formation of the dielectric material, the dielectric material may be etched to leave the three sidewall spacers 812a, 812b and 812c only on the sidewalls of the dummy structures 700.

The S/D structures 800 are formed by epitaxially growing a semiconductor material from the exposed portions of the fins 412. Various suitable methods can be used to epitaxially grow the S/D structures 800 such as, for example, metal-organic CVD (MOCVD), molecular beam epitaxy (MBE), liquid phase epitaxy (LPE), vapor phase epitaxy (VPE), selective epitaxial growth (SEG), the like, or combinations thereof.

In some embodiments, when the resulting semiconductor device 100 is an n-type FinFET, the S/D structures 800 may include silicon carbide (SiC), silicon phosphorous (SiP), phosphorous-doped silicon carbon (SiCP), or the like. When the resulting FinFET is a p-type FinFET, the S/D structures 800 may include SiGe, and a p-type impurity such as boron or indium.

The S/D structures 800 may be implanted with dopants to form the S/D structures 800, followed by an anneal process. The implanting process may include forming and patterning masks such as a photoresist to cover the regions of the device 100 that are to be protected from the implanting process. The S/D structures 800 may have an impurity (e.g., dopant) concentration in a range from about $1\times10^{19}$ cm$^{-3}$ to about $1\times10^{21}$ cm$^{-3}$. P-type impurities, such as boron or indium, may be implanted in the S/D structures 800 of a P-type transistor. N-type impurities, such as phosphorous or arsenide, may be implanted in the S/D structures 800 of an N-type transistor. In some embodiments, the epitaxial S/D structures 800 may be in situ doped during growth.

Figure 9:
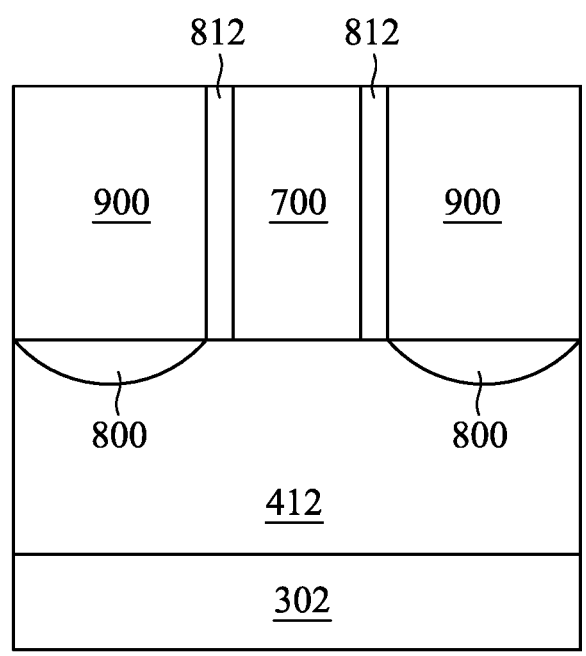

Corresponding to the operation 214 of FIG. 2, FIG. 9 is a view of the semiconductor device 100 in which an inter-level dielectric (ILD) 900 is formed at one of the various stages of fabrication, according to some embodiments. The ILD 900 is formed over the fins 412 and the S/D structures 800, and is formed in regions between the dummy gate structure 700. In some embodiments the ILD 900 may be formed after a poly cut process (see FIG. 10A). In some embodiments, the ILD 900 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD 900 is formed, a planarization process, such as a CMP process, may be performed to achieve a level upper surface for the ILD 900. After the planarization process, the upper surface of the ILD 900 can be level with the upper surface of the dummy gate structure 600, in some embodiments.

Figure 10A:
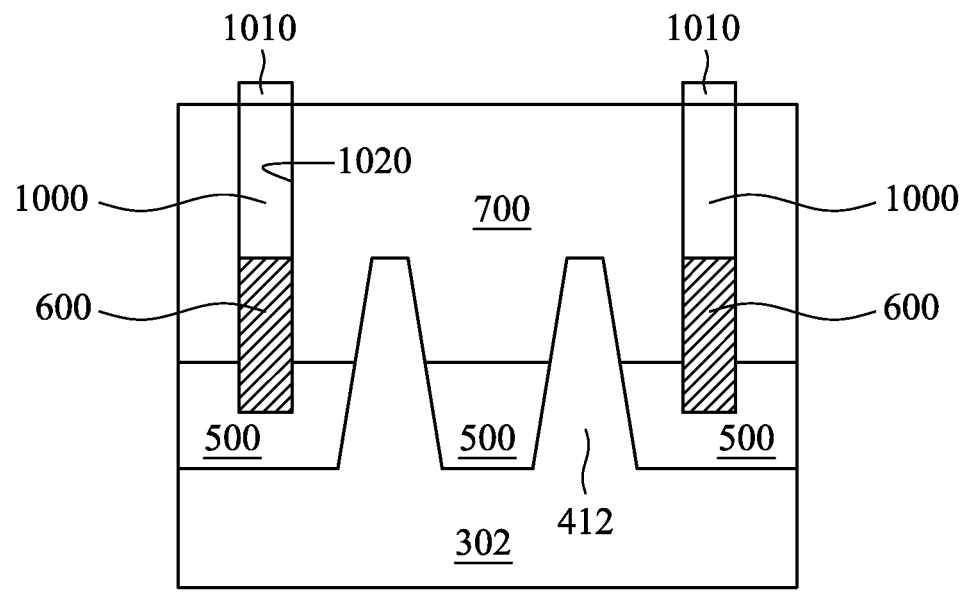
Figure 10B:
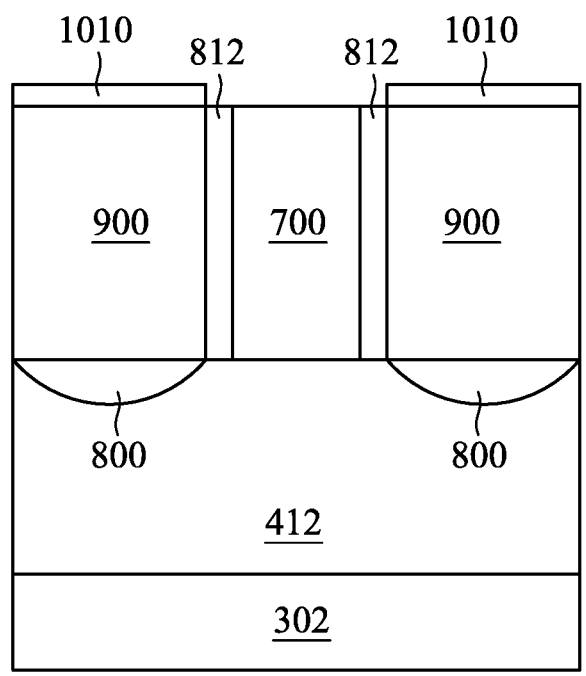

Corresponding to the operation 216 of FIG. 1, FIGS. 10A and 10B are views of the semiconductor device 200 in which a dielectric structure is formed through the dummy gate structure 700 to contact the dummy fins 600 at one of the various stages of fabrication, according to some embodiments. FIG. 10A illustrate a Y-cut in region B, showing a cut poly process, and FIG. 10B illustrates an X-cut cross sectional view.

The dummy gate structure 700 may be etched using an etch mask to form holes 1020 extending from a top surface of the dummy gate structure 700 to the dummy fins 600. The dummy gate structure 700 may be etched by an appropriate etchant, and may be etched using RIE, for example.

A dielectric refill material 1000 is formed in the holes 1020. The dielectric material 1000 may be, for example, silicon oxide, silicon nitride, silicon oxynitride, silicon carbide, silicon carbonitride, silicon oxycarbonitride, silicon oxycarbide, multilayers thereof, or the like. The dielectric refill material 1000 can be formed by depositing the dielectric refill material in the holes 1020 using any suitable method, such as CVD, PECVD, or FCVD. The dielectric refill material 1000 may be planarized, such as by CMP to remove the dielectric refill material 1000 from a top surface of the dummy gate structure 700, if needed. A hard mask 1010 formed of for example SiN, may be formed on the top of the dielectric refill material 1000 to act as an etch mask in further etch processing.

Figure 11A:
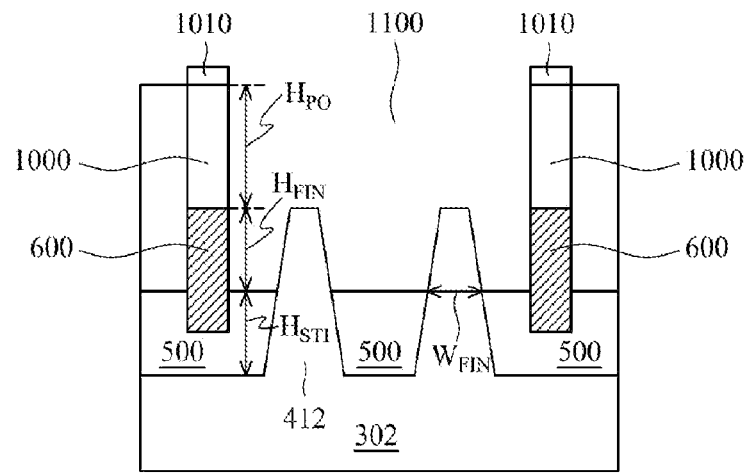
Figure 11B:
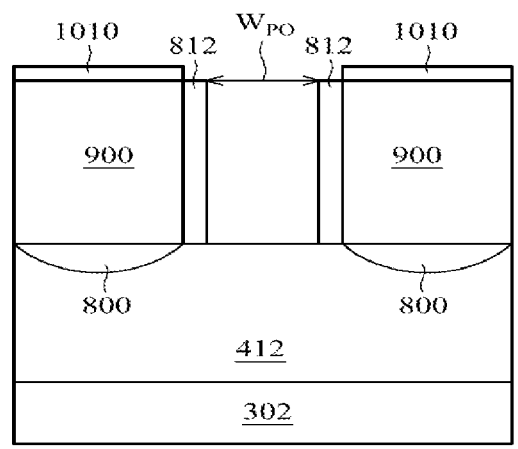

Corresponding to the operation 218 of FIG. 2, FIGS. 11A and 11B are views of the semiconductor device 100 in which the portion of the dummy gate structure 700 between the dielectric refill material 1000 in region B is removed to form a cavity 1100 between the dielectric refill material 1000 and dummy fins 600. The dummy gate structure 700 may be removed, for example, by an appropriate etch. For example, one or more isotropic etching processes may be performed.

FIGS. 11A and 11B further illustrate parameters of the device structure before the three stage etch. The height of the fins 412 above a top surface of the isolation regions 500 is if $H_{FIN}$, and may be in the range of about 5 to 200 nm. The height of the dielectric material 1000 above a top surface of the dummy fins 412 is if $H_{PO}$, and may be in the range of about 5 to 200 nm. The height of the isolation regions 500 above a top surface of the substrate 302 is $H_{STI}$, and may be in the range of about 5 to 200 nm. The width of the fins 412 at the top surface of the isolation regions 500 is $W_{FIN}$, and may be in the range of about 2 to 50 nm. As seen in FIG. 11B, the width of the dummy gate structure 700 between the ILD 900 is $W_{PO}$, and may be in the range of about 5 to 200 nm.

Figure 12A:
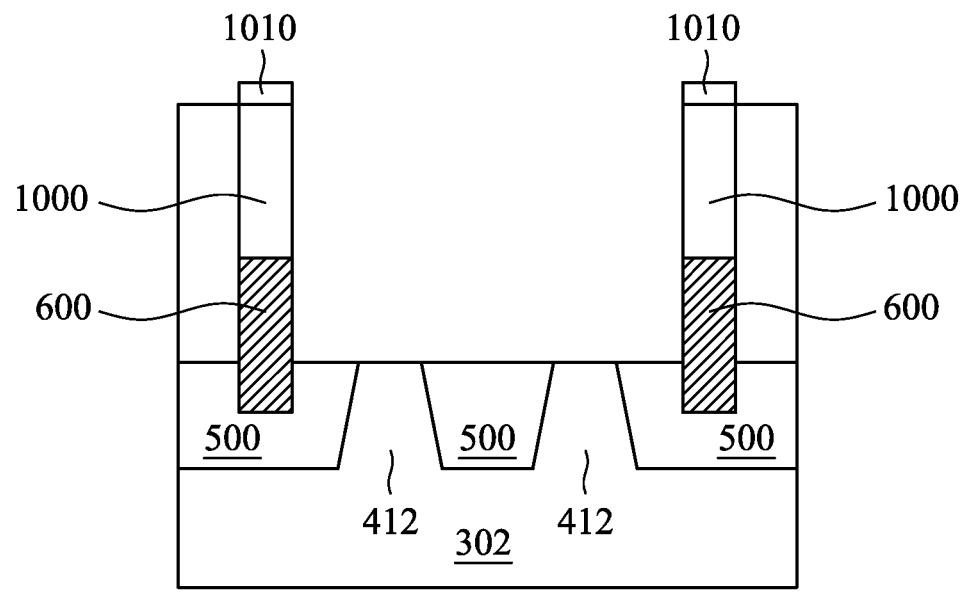
Figure 12B:
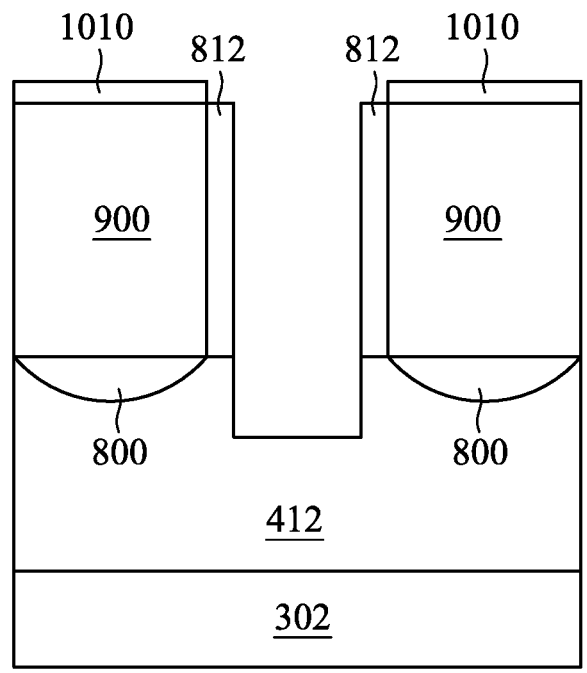

Corresponding to the operation 220 of FIG. 2, FIGS. 12A and 12B are views of the semiconductor device 100 in which a first etch is performed to remove the top of the fins 412 such that a top surface of the fins 412 has a same height as a top surface of the isolation regions 500. In this case $H_{FIN}$ becomes 0, and $H_{STI}$ remains the same. The first etch may be performed using a first etchant, and may be a dry etch, such as RIE, for example. The first etch may be selective to etching the fins 412 over the isolation regions 500. The first etch may be performed with an appropriate etchant, such as HBr, for example, where the etching conditions selectively etch the fins 412 over the isolation regions 500.

Figure 13A:
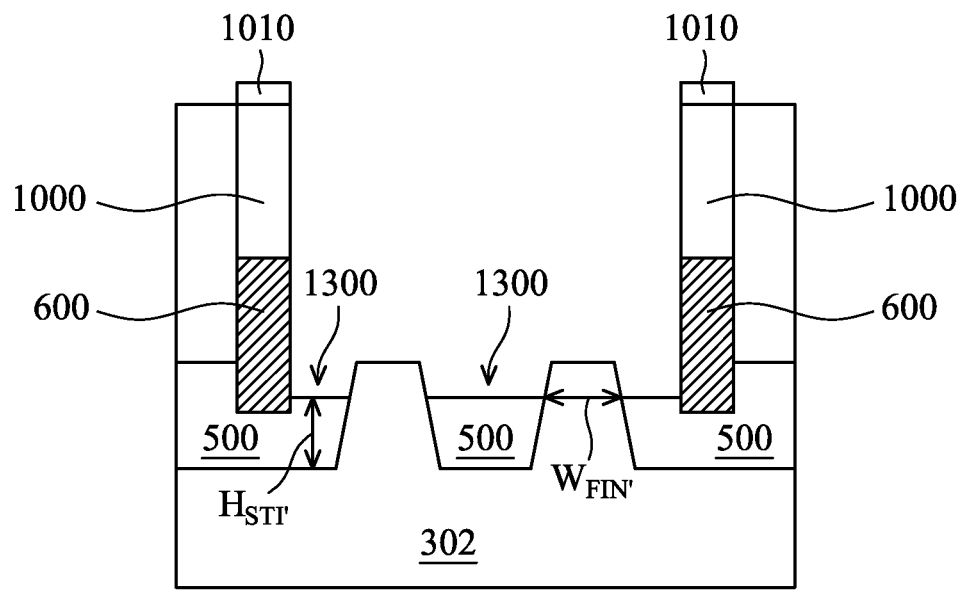
Figure 13B:
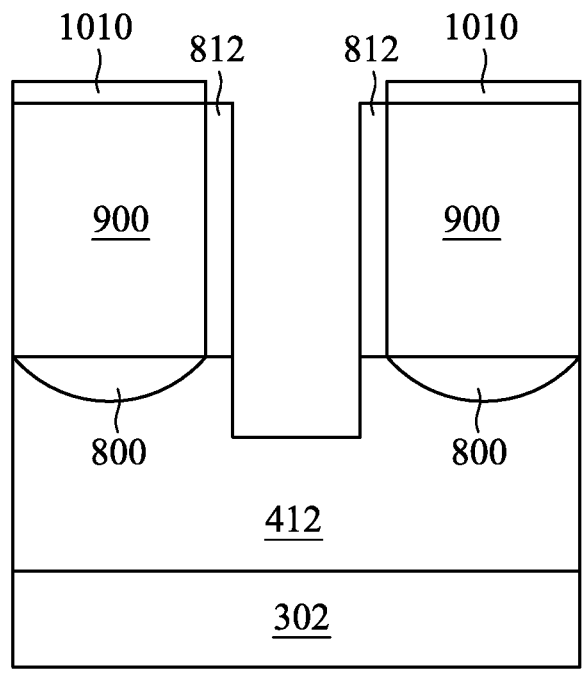

Corresponding to the operation 222 of FIG. 2, FIGS. 13A and 13B are views of the semiconductor device 100 in which a second etch is performed to selectively etch the isolation region 500 to form a first recess 1300 in the isolation region 500 laterally adjacent the fins 412. Thus the second etch can provide a push of the isolation region 500. After the second etch, the height of the isolation regions 500 above a top surface of the substrate 302 in the region of the first recess 1300 is $H_{STI}'$, where $H_{STI}'$ is less than $H_{STI}$. In general, $H_{STI}'$ is greater than or equal to 0, and less than $H_{STI}$.

Further, after the second etch, the width of the fins 412 at the top surface of the isolation regions 500 in the region of the first recess is $W_{FIN}'$, which may be greater than the width of the fins 412 $W_{FIN}$. This increase in width at the first recess 1300 region leads to a lower aspect ratio for the second recess formed in the substrate 302 as described below. Further, the increase in width of the fin 412 at the first recess 1300 region leads to an increased recess depth in the substrate 302.

The second etch may be performed using a second etchant, and may be a dry etch, such as RIE, for example. The second etch may be selective to etching the isolation regions 500 over the fins 412. The second etch may be performed with an appropriate second etchant, such as a fluorine based etchant, for example, where the etching conditions selectively etch the isolation regions 500 as compared to the fins 412. The fluorine based etchant may be $CF_4$ or $C_4F_6$, for example. The second etchant may be different from the first etchant.

Figure 14A:
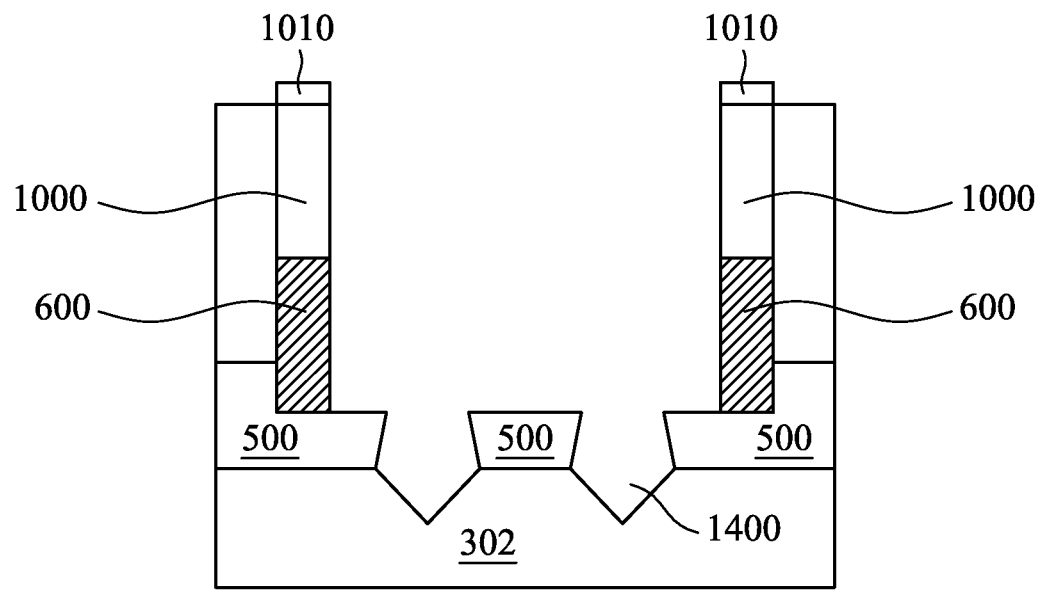
Figure 14B:
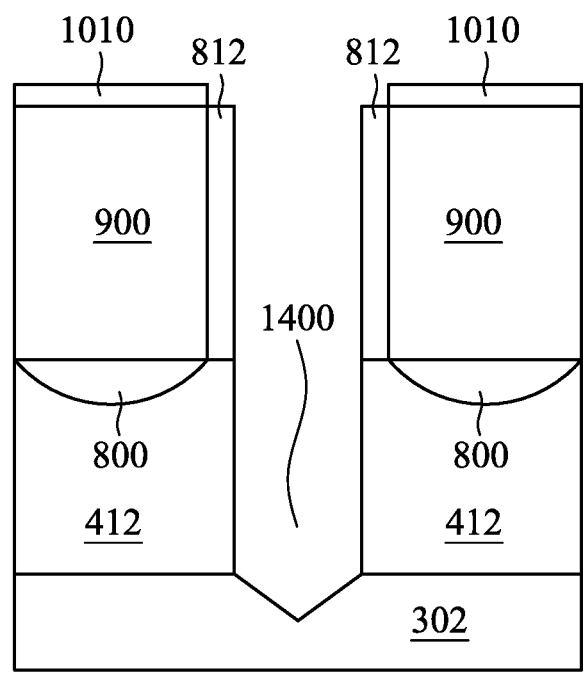

Corresponding to the operation 224 of FIG. 2, FIGS. 14A and 14B are views of the semiconductor device 100 in which a third etch is performed to selectively etch the fins 412 and substrate 302 as compared to the isolation regions 500 to form a second recess 1400 through the isolation regions 500 and into the substrate 302. The third etch may be performed using a third etchant, and may be a dry etch, such as RIE, for example. The third etch may be selective to etching the fins 412 and substrate as compared to the isolation regions 500. The third etch may be performed with an appropriate etchant, such as HBr, for example, where the etching conditions selectively etch the fins 412 over the isolation regions 500. The third etchant may be the same as the first etchant and different from the second etchant. The third etch process may include a first sub-etch to remove the fins 412, followed by a second sub-etch etch to etch into the substrate 302.

As described above, after the second etch, the width of the fins 412 at the top surface of the isolation regions 500 in the region of the first recess is $W_{FIN}'$, which may be greater than the width of the fins 412 $W_{FIN}$. This increase in width at the first recess 1300 region leads to a lower aspect ratio for the second recess 1400 formed in the substrate 302 during the third etch. Further, the increase in width at the first recess 1300 region leads to an increased recess depth in the substrate 302.

The etching of the isolation region in the second etch beneficially enlarges the opening critical dimension (CD) prior to subsequent etching to remove the fin bottom and etch into the semiconductor substrate. The etching of the isolation region reduces the aspect ratio for the fin removal and etch into the semiconductor substrate. Under the lower aspect ratio it is easier to perform fin bottom removal and silicon substrate etch leading to better performance. Further the process window is enlarged and yield is improved.

Figure 15A:
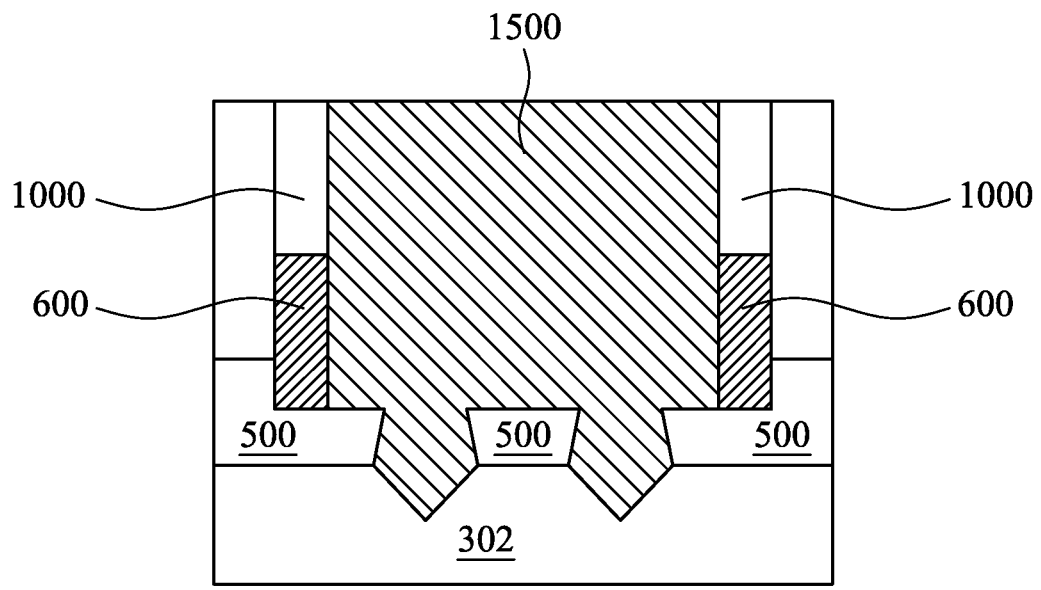
Figure 15B:
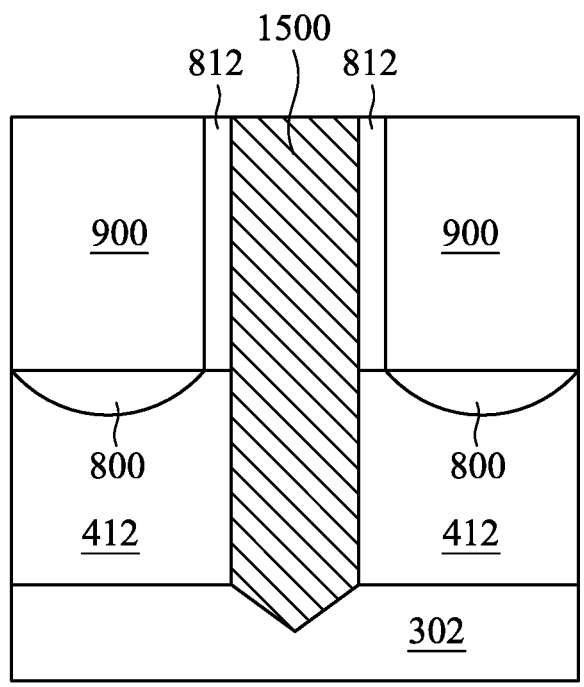

Corresponding to the operation 226 of FIG. 2, FIGS. 15A and 15B are views of the semiconductor device 100 in which a dielectric material 1500 is formed to fill the second recess 1400 and cavity 1100 to contact side surfaces of the dummy fins 600. In various embodiments, the dielectric material 1500 may be, for example, silicon oxide, silicon nitride, silicon oxynitride, silicon carbide, silicon carbonitride, silicon oxycarbonitride, silicon oxycarbide, multilayers thereof, or the like. The dielectric material 1500 can inherit the profiles and dimensions of the cavity 1100 (FIG. 11).

Figure 16:
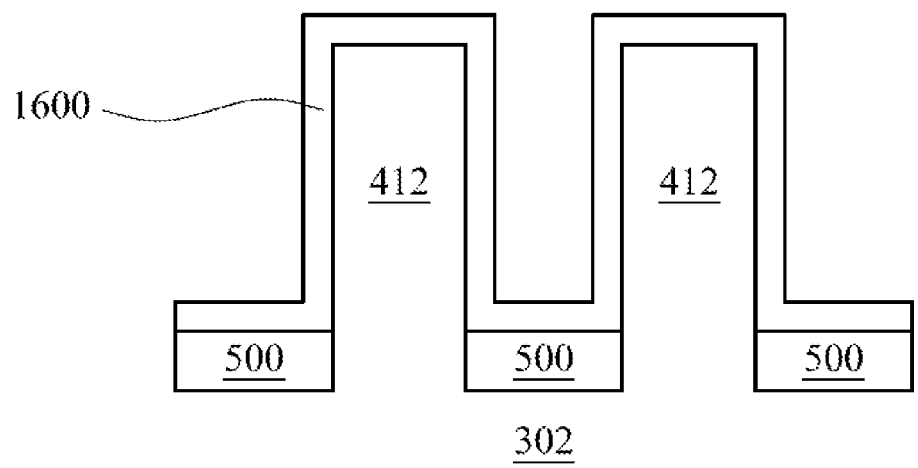

Corresponding to the operation 228 of FIG. 2, FIG. 16 is a view of the semiconductor device 100 in which the dummy gate structure 700 is removed in the region A (second region) of the device prior to formation of a conducting gate, and then a gate dielectric 1600 is formed over the fins 412. The dummy gate structure 700 is removed in the region A using an appropriate etchant. The gate dielectric 1600 may include a high-k dielectric material (e.g., with a k value greater than about 4.0 or even greater than about 7.0). In such embodiments, the high-k dielectric may include a material selected from: $Al_2O_3$, HfAlO, HfAlON, AlZrO, $HfO_2$, $HfSiO_x$, $HfAlO_x$, $HfZrSiO_x$, HfSiON, $LaAlO_3$, $ZrO_2$, or combinations thereof. The high-k dielectric may be formed using a suitable process such as ALD, CVD, PVD, plating, or combinations thereof.

Figure 17:
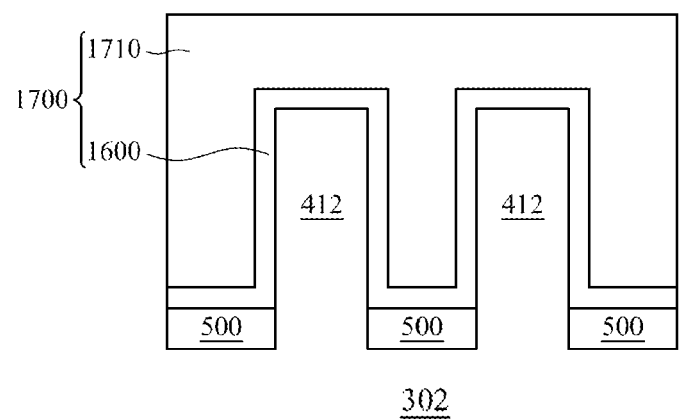

Corresponding to the operation 230 of FIG. 2, FIG. 17 is a view of the semiconductor device 100 in which a conducting gate 1700 is formed. The conducting gate 1700 may include the gate dielectric 1600 and a gate electrode 1710. The central portions of the fins 412 are overlaid by the conductive gate electrode 1710 with the gate dielectric layer 1600 sandwiched therebetween. The gate electrode 1710 may include a metal material such as, for example, Al, Cu, W, Ti, Ta, TiN, TiAl, TiAlN, TaN, NiSi, CoSi, or combinations thereof. In some other embodiments, the gate electrode 1710 may include a polysilicon material. The polysilicon material may be doped with a uniform or non-uniform doping concentration. The gate electrode 1710 may be formed using a suitable process such as ALD, CVD, PVD, plating, or combinations thereof.

The gate electrode 1710 may include a stack of multiple metal materials. For example, the gate electrode 1710 may be a p-type work function layer, an n-type work function layer, multi-layers thereof, or combinations thereof. The work function layer may also be referred to as a work function metal. Example p-type work function metals that may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process.

In one aspect of the present disclosure, a method of fabricating a semiconductor device includes forming a plurality of semiconductor fins in a first region on a substrate and forming an isolation region around the plurality of semiconductor fins, a top surface of the plurality of semiconductor fins being above a top surface of the dielectric isolation. The method also includes performing a first etch to etch the plurality of semiconductor fins such that a top surface of the plurality of semiconductor fins has a same height as a top surface of the isolation region. The method further includes performing a second etch selectively etching the isolation region to form a first recess in the isolation region laterally adjacent the semiconductor fins and performing a third etch selectively etching the plurality of semiconductor fins to remove the plurality of semiconductor fins and to etch a second recess through the isolation region into the semiconductor substrate.

In another aspect of the present disclosure, a method of fabricating a semiconductor device includes forming a plurality of semiconductor fins in a first region on a substrate and forming an isolation region around the plurality of semiconductor fins, a top surface of the plurality of semiconductor fins being above a top surface of the isolation region. The method further includes performing a first etch using a first etchant to etch the plurality of semiconductor fins such that a top surface of the plurality of semiconductor fins has a same height as a top surface of the isolation region, performing a second etch using a second etchant, different from the first etchant, to etch the isolation region to form a first recess in the isolation region laterally adjacent the semiconductor fins, and performing a third etch using a third etchant, different from the second etchant, to etch the plurality of semiconductor fins to remove the plurality of semiconductor fins and etch a second recess through the isolation region into the semiconductor substrate.

In another aspect of the present disclosure, a semiconductor device includes a semiconductor substrate, an isolation region disposed on the semiconductor substrate, a plurality of dummy fins in a first region extending from the isolation region, and a dielectric material extending through the isolation region and into the semiconductor substrate, the dielectric material disposed between the plurality of dummy fins. A height of the isolation region on an inner side of the plurality of dummy fins being less than a height of the isolation region on an outer side of the plurality of dummy fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a semiconductor substrate;
an isolation region disposed on the semiconductor substrate;
a plurality of dummy fins in a first region extending from the isolation region;
a dielectric material extending through the isolation region and into the semiconductor substrate, the dielectric material disposed between the plurality of dummy fins; and
a dielectric refill material disposed above and contacting the plurality of dummy fins, wherein the dielectric refill material is tapered with a width increasing from a bottom to a top of the dielectric refill material.

2. The semiconductor device of claim 1, wherein the plurality of dummy fins are formed of a dielectric material.

3. The semiconductor device of claim 1, further comprising at least one semiconductor fin.

4. The semiconductor device of claim 3, further comprising a metal gate disposed over the at least one fin.

5. The semiconductor device of claim 3, further comprising source and drain structures disposed in the at least one semiconductor fin.

6. The semiconductor device of claim 5, further comprising an interlevel dielectric disposed above the source and drain structures.

7. The semiconductor device of claim 1, wherein the plurality of semiconductor fins are tapered with a width increasing from a bottom to a top of the plurality of semiconductor fins.

8. The semiconductor device of claim 1, further comprising forming at least one semiconductor fin in a second region.

9. A semiconductor device, comprising:
a semiconductor substrate;
an isolation region disposed on the semiconductor substrate;
a plurality of dummy fins in a first region extending from the isolation region; and
a dielectric material extending through the isolation region and into the semiconductor substrate, the dielectric material disposed between the plurality of dummy fins, and
wherein the plurality of semiconductor fins are tapered with a width increasing from a bottom to a top of the plurality of semiconductor fins.

10. The semiconductor device of claim 9, wherein the plurality of dummy fins are formed of a dielectric material.

11. The semiconductor device of claim 9, further comprising at least one semiconductor fin.

12. The semiconductor device of claim 11, further comprising a metal gate disposed over the at least one fin.

13. The semiconductor device of claim 11, further comprising source and drain structures disposed in the at least one semiconductor fin.

14. A semiconductor device, comprising:
a semiconductor substrate;
an isolation region disposed on the semiconductor substrate;
a plurality of dummy fins in a first region extending from the isolation region; and
a dielectric material extending through the isolation region and into the semiconductor substrate, the dielectric material disposed between the plurality of dummy fins;
wherein a height of the isolation region on an inner side of the plurality of dummy fins is less than a height of the isolation region on an outer side of the plurality of dummy fins.

15. The semiconductor device of claim 14, wherein the plurality of dummy fins are formed of a dielectric material.

16. The semiconductor device of claim 14, further comprising at least one semiconductor fin.

17. The semiconductor device of claim 16, further comprising a metal gate disposed over the at least one semiconductor fin.

18. The semiconductor device of claim 16, further comprising source and drain structures disposed in the at least one semiconductor fin.

19. The semiconductor device of claim 18, further comprising an interlevel dielectric disposed above the source and drain structures.

20. The semiconductor device of claim 14, further comprising a dielectric refill material disposed above and contacting the plurality of dummy fins, the dielectric refill material is tapered with a width increasing from a bottom to a top of the dielectric refill material.

* * * * *